US011236863B2

(12) United States Patent
Ruiz-Rodriguez et al.

(10) Patent No.: US 11,236,863 B2
(45) Date of Patent: Feb. 1, 2022

(54) AUTOMATED CRYOGENIC REFILLING SYSTEM

(71) Applicant: UT-Battelle, LLC, Oak Ridge, TN (US)

(72) Inventors: Mariano M Ruiz-Rodriguez, Knoxville, TN (US); Saad R Elorfi, Lafollette, TN (US); Christopher M Redmon, Rockwood, TN (US); Ryan J Morgan, Lancing, TN (US)

(73) Assignee: UT-BATTELLE, LLC, Oak Ridge, TN (US)

( * ) Notice: Subject to any disclaimer, the term of this patent is extended or adjusted under 35 U.S.C. 154(b) by 413 days.

(21) Appl. No.: 16/225,396

(22) Filed: Dec. 19, 2018

(65) Prior Publication Data

US 2019/0211970 A1    Jul. 11, 2019

Related U.S. Application Data

(60) Provisional application No. 62/614,555, filed on Jan. 8, 2018.

(51) Int. Cl.
*F17C 13/00* (2006.01)
*F17C 13/08* (2006.01)
(Continued)

(52) U.S. Cl.
CPC .............. *F17C 5/06* (2013.01); *F17C 13/025* (2013.01); *F17C 2221/017* (2013.01);
(Continued)

(58) Field of Classification Search
CPC ...... F17C 2250/0408; F17C 2250/0413; F17C 2250/0417; F17C 2250/061; F17C 3/08;
(Continued)

(56) References Cited

U.S. PATENT DOCUMENTS 2,580,710 A *  1/1952 Wildhack .................. F17C 9/02
                                                    62/50.2
3,200,389 A *  8/1965 Damico ................ G01F 23/161
                                                    222/23
(Continued)

*Primary Examiner* — Jianying C Atkisson
*Assistant Examiner* — Erik Mendoza-Wilkenfel
(74) *Attorney, Agent, or Firm* — Warner Norcross + Judd LLP

(57) ABSTRACT

An improved system and method for the automated refilling of cryogenic helium is provided. In one embodiment, the system includes a dewar in fluid communication with a liquid helium cryostat through a cryogen transfer line. A controller regulates operation of a three-way valve to pre-cool the transfer line and to cause gaseous helium to flow to the dewar and force liquid helium through the transfer line into the cryostat. The controller is coupled to the output of a cryogenic level sensor, such that the controller regulates the helium liquid level within the cryostat. During filling cycles, the dewar liquid level is also monitored by the cryogenic level sensor and an alarm sounds if the dewar liquid level is undesirably low. Between filling cycles, the controller is operable to ventilate the dewar through a solenoid vent valve in fixed time intervals to ensure the dewar pressure is sufficiently low so as to not bleed liquid helium into the cryostat.

9 Claims, 2 Drawing Sheets

(51) Int. Cl.
*F17C 5/06* (2006.01)
*F17C 13/02* (2006.01)

(52) U.S. Cl.
CPC ... *F17C 2223/0161* (2013.01); *F17C 2223/033* (2013.01); *F17C 2225/0123* (2013.01); *F17C 2250/043* (2013.01)

(58) Field of Classification Search
CPC .... F17C 3/085; F17C 13/006; F17C 2205/03; F17C 2205/037; F17C 2205/0376
See application file for complete search history.

(56) References Cited

U.S. PATENT DOCUMENTS

| | | | | |
|---|---|---|---|---|
| 3,316,726 | A * | 5/1967 | Pauliukonis | F25D 29/001 62/52.1 |
| 3,938,347 | A * | 2/1976 | Riedel | F16C 13/02 62/49.2 |
| 4,241,592 | A * | 12/1980 | Tapphorn | E21B 47/017 62/51.1 |
| 4,744,222 | A * | 5/1988 | Murai | F17C 13/021 62/49.2 |
| 5,704,965 | A * | 1/1998 | Tom | F17C 11/00 95/95 |
| 8,602,049 | B2 * | 12/2013 | Lose | F17C 13/025 137/209 |

* cited by examiner

US 11,236,863 B2

AUTOMATED CRYOGENIC REFILLING SYSTEM

CROSS-REFERENCE TO RELATED APPLICATION

This application claims the benefit of U.S. Provisional Application 62/614,555, filed Jan. 8, 2018, the disclosure of which is hereby incorporated by reference in its entirety.

STATEMENT REGARDING FEDERALLY SPONSORED RESEARCH AND DEVELOPMENT

This invention was made with government support under Contract No. DE-AC05-00OR22725 awarded by the U.S. Department of Energy. The government has certain rights in the invention.

BACKGROUND OF THE INVENTION

The present invention relates to automated refilling systems for cryogenic helium and other liquids, optionally for use with superconducting magnet systems.

Cryogenic liquids, including helium and nitrogen, are used in operations where superconductive magnets are required, for example in magnetic resonance imaging and nuclear magnetic resonance. Cryogenic liquids have boiling points much lower than room temperature (−452° F. and −320° F., respectively) and are typically stored in a cryostat. Liquid helium, for example, will warm during cooling of the magnets and some portion of the liquid helium will boil off. Consequently, liquid helium must be added to the cryostat during ongoing operations.

Liquid helium for refilling of the cryostat is typically stored in one or more dewars. Dewars are self-pressuring, in that the vapor pressure within a dewar increases as the liquid boils off. Dewars often include a high vacuum between wall layers to provide thermal insulation.

In practice, it is often difficult and time consuming to fill cryostats with liquid helium from one or more helium dewars. Filling with liquid helium can be a challenge, from filling every day or twice a day depending on the type of cryostat or magnets. Accordingly, there remains a continued need for an improved system and method for refilling liquid helium and other cryogenic liquids for superconducting magnets and other applications.

SUMMARY OF THE INVENTION

An improved system and method for the automated refilling of cryogenic helium is provided. In one embodiment, the system includes a dewar in fluid communication with a liquid helium cryostat through a cryogen transfer line. A controller regulates operation of a three-way valve to pre-cool the transfer line and to cause gaseous helium to flow to the dewar and force liquid helium through the transfer line into the cryostat. The controller is coupled to the output of a cryogenic level sensor, such that the controller regulates the helium liquid level within the cryostat. During filling cycles, the dewar liquid level is also monitored by the cryogenic level sensor and an alarm sounds if the dewar liquid level is undesirably low. Between filling cycles, the controller is operable to ventilate the dewar through a solenoid vent valve in fixed time intervals to ensure the dewar pressure is sufficiently low so as to not bleed liquid helium into the cryostat.

In another embodiment, a method is provided for refilling a helium storage cryostat, optionally a MRI cryostat or an NMR cryostat. The method includes venting gaseous helium from a dewar containing liquid helium and pre-cooling a transfer line in fluid communication between the dewar and the helium storage cryostat by lowering the pressure therein. The method further includes feeding gaseous helium to the dewar to force the liquid helium through the pre-cooled transfer line and into the helium storage cryostat. The method further includes stopping the flow of gaseous helium into the dewar in response to the level of liquid helium within the helium storage cryostat reaching a predetermined level. Lastly, the method includes venting gaseous helium from the dewar to prevent the build-up of pressure from within the dewar while the transfer line remains coupled to the dewar and the helium storage cryostat between filling cycles.

The system and method of the present invention therefore provides automated re-filling of a cryostat with helium. The system and method can overcome challenges associated with manual filling operations with minimal helium losses observed during laboratory testing. These and other features and advantages of the present invention will become apparent from the following description of the invention, when viewed in accordance with the accompanying drawings and the appended claims.

DETAILED DESCRIPTION OF THE CURRENT EMBODIMENT

Figure 1:
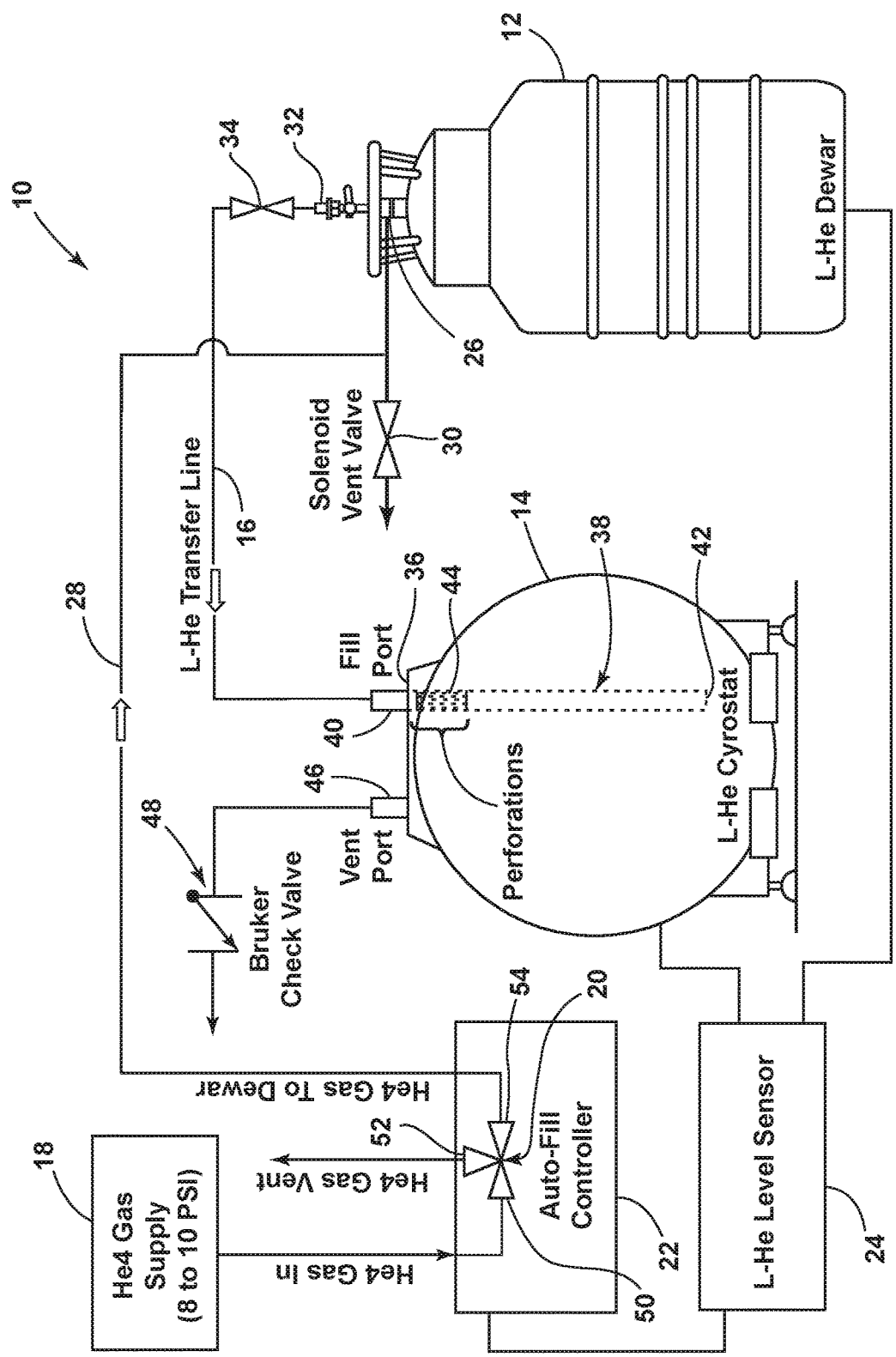
FIG. 1 is a schematic diagram of an automated cryogenic refilling system in accordance with a current embodiment.

An automated cryogenic refilling system in accordance with a current embodiment is illustrated in FIG. 1 and generally designated 10. The system 10 generally includes a dewar 12 containing liquid helium, a helium storage cryostat 14 in fluid communication with the dewar 12 through a liquid helium transfer line 16, and a source of gaseous helium 18 in fluid communication with the dewar 12 through a three-position electronic fill valve 20. The fill valve 20 is responsive to a controller 22 coupled to the output of a liquid level meter 24 to automatically refill the liquid level within the helium storage cryostat 14 with minimal helium losses. A system overview is discussed below, followed by a discussion of its method of operation and a laboratory example.

I. System Overview

As shown in FIG. 1, the dewar 12 includes a first port 26 in fluid communication with a gas transfer line 28 and a solenoid vent valve 30. The gas transfer line 28 transfers a push gas, for example gaseous helium, to the dewar 12. The source of gaseous helium 18 is optionally a cylinder that is pressurized to between 8 PSI and 10 PSI. The push gas forces liquid helium from the dewar 12 into the liquid helium transfer line 16 through a second port 32 and isolation valve 34. While some dewars include a built-in liquid level sensor, the current embodiment includes a separate liquid level meter 24 coupled to sensors in both the dewar 12 and the cryostat 14. The Model 1800 Liquid Level Instrument by American Magnetics Inc. is one example of a liquid level meter. The liquid level meter 24 is interfaced with an L-He transmitter having a constant current source and an ADC converter to digitize the resulting level-dependent sensor voltage.

As also shown in FIG. 1, the liquid transfer line 16 feeds liquid helium to the cryostat 14 through a fill port 36. The system 10 further includes a tube-like extension 38 joined to the liquid transfer line 16 and inserted within the cryostat fill port 36. The extension 38 is formed of high-pressure fiber-glass laminate (e.g., G10) in the current embodiment, while other materials can be used in other embodiments. The extension 38 includes a threaded upper end 40 attached to the cryostat transfer line 16 and includes an open bottom end 42 at the bottom of the liquid helium bath of the cryostat 14. The extension 38 is substantially rigid and includes exhaust holes nearer to the top end (above the liquid line) to ventilate boil-off from the transfer line 16, which would otherwise increase the heat load on the cryostat 14. The cryostat 14 also includes a vent port 46 coupled to a check valve 48, for example a Bruker check valve. The cryostat 14 is optionally an MRI cryostat or an NMR cryostat, although other cryostats can be used in other embodiments. Like the dewar 12, the liquid level within the cryostat 14 is measured by the liquid level meter 24, the output of which is provided to the auto-fill controller 22 as an electrical signal.

As noted above, the system 10 also includes a three-position electronic fill valve 20. The fill valve 20 includes a first port 50 coupled to the output of the gaseous helium supply 18, a second (ventilation) port 52 for the ventilation of gaseous helium, and a third port 54 coupled to the gas transfer line 28. The fill valve 20 is controlled from an analog voltage that determines the percentage that the valve opens. Varying this input voltage changes the amount of pressure that passes through the gas transfer line 28. The fill valve 20 is responsive to the controller 22 for pre-cooling and for the fill cycle in the manner described in Part II below.

II. Method of Operation

Figure 2:
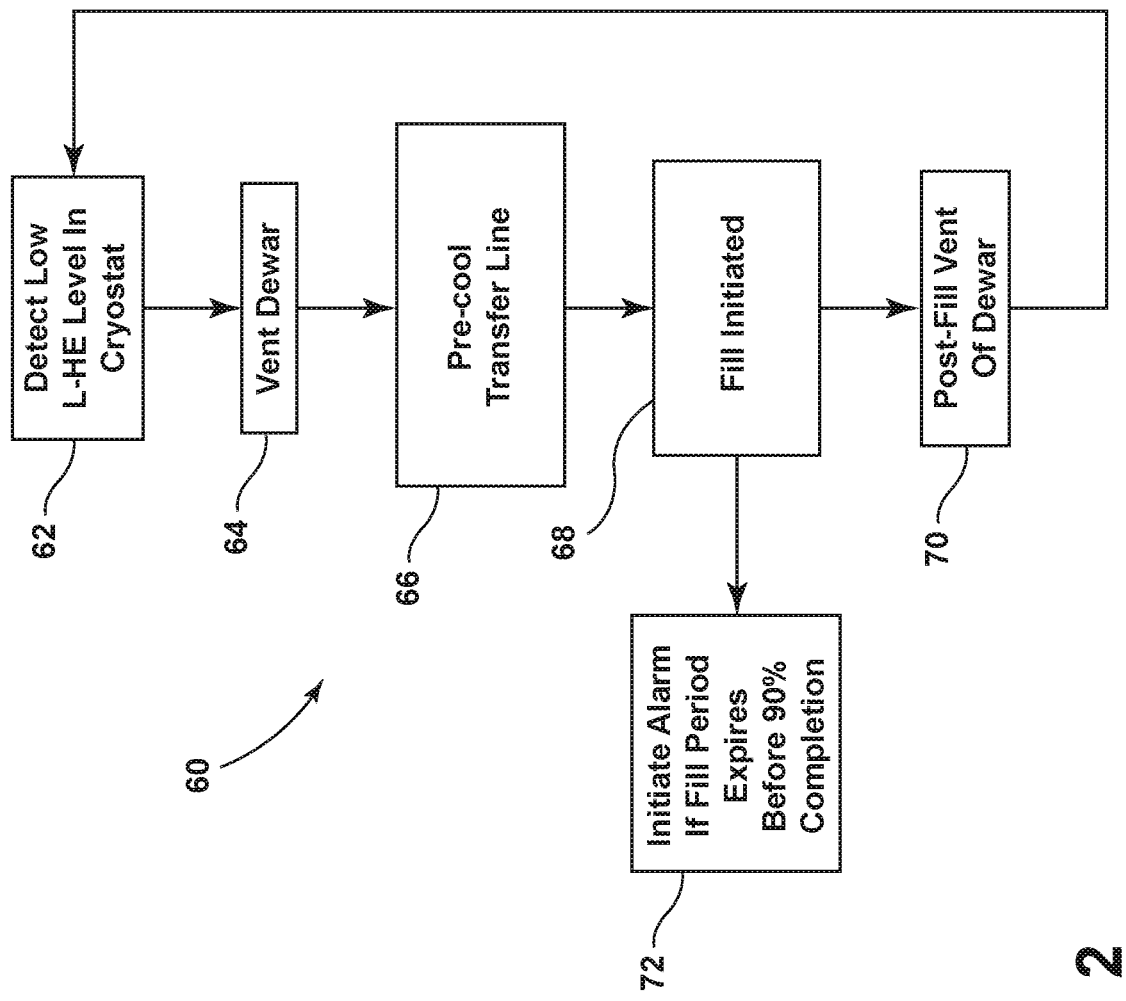
FIG. 2 is a flow chart illustrating operation of the automated cryogenic refilling system of FIG. 1.

Referring now to FIG. 2, a method for refilling the helium storage cryostat is illustrated and generally designated 60. The method generally includes (a) measuring the liquid level within the cryostat at step 62, (b), venting the dewar at step 64, (c) pre-cooling the cryogen transfer line at step 66, (d) feeding gaseous helium to the dewar to force liquid helium through the cryogen transfer line and into the cryostat at step 68, (e) and venting gaseous helium between filing operations while regularly monitoring the liquid level within the cryostat at step 70. The method further optionally includes initiating an alarm at step 72. Each step is discussed in greater detail below.

At step 62, measuring the liquid level within the cryostat 14 is performed using the liquid level meter 24. The liquid level meter 24 provides an output to the controller 22, the output being a digital voltage value that is indicative of the liquid level within a helium storage cryostat 14. The measured liquid levels are then compared by the controller 22 against a lower trigger level and an upper trigger level stored to computer readable memory.

Ventilation of the dewar 12 at step 64 occurs in response to the measured liquid level declining to the lower trigger level. Ventilation of the cryostat 14 includes opening the solenoid vent valve 30 for a predetermined minimum time period, three minutes in the current embodiment, to prevent an uncontrolled pressure increase in the dewar 12, which would otherwise transfer gases to the cryostat 14, increasing its heat load and reducing its efficiency At step 66, pre-cooling the liquid transfer line 16 includes the low pressurization of the supply helium within the dewar 12. This process is controlled by the controller 22, with the pressure being reduced to 0.5 PSI in the present embodiment. In particular, the three-position electronic fill valve 22 is set to a low pressure which directs $He^4$ gas into the first port 50 of the fill valve 20, exiting through the third port 54 to the gas transfer line 28. Depending on the length of liquid transfer line 16, pre-cooling can be accomplished in approximately 20 minutes in some embodiments by triggering this low pressure into the liquid transfer line 16 to the cryostat 14. The exhaust holes 44 in the extension 38, being above the cryostat liquid level, allow for hot-precooling gases to exit and be exhausted from the cryostat 14, through the vent port 46, with minimal impact to the liquid helium level within the cryostat 14.

At step 68, feeding gaseous helium to the dewar 12 to force liquid helium through the pre-cooled cryogen transfer line 16 and into the cryostat 14 is performed with actuation of the three-position electronic fill valve 20. When the pre-cooling process is complete, the fill valve 20 adjusts to a higher pressure, ex. 1.2 PSI in the current embodiment, for the remainder of the fill cycle. The fill cycle continues until the liquid level within the cryostat 14, as measured by the liquid level meter 22, reaches the upper trigger level. When the fill cycle is complete, the controller 22 causes the first port 50 to close and causes the second port 52 to open to the third port 54. This allows a continuous slow vent from the helium dewar 12 to prevent pressure build-up in the dewar 12, which would otherwise initiate an unwanted transfer.

Step 70 includes venting gaseous helium between filing operations while regularly monitoring the liquid level within the cryostat 14. During this time, the dewar 12 remains in fluid communication with the cryostat 14 through the liquid transfer line 16. Because the dewar 12 is not an ideal vacuum, conductive and radiative heat loads cause the liquid helium within the dewar 12 to slowly boil. The production of gaseous helium causes the pressure in the dewar 12 to increase. Venting of the gaseous helium prevents an uncontrolled pressure increase in the dewar 12, which would otherwise transfer gases to the cryostat 14, increasing its heat load and reducing its efficiency. By periodically venting the dewar 12 through the solenoid vent valve 30 between fill cycles, these effects are minimized and the dewar 12 is maintained at a lower internal pressure than the cryostat 14.

At step 72, the method optionally includes initiating an alarm, & securing the fill process, if the fill period expires before the cryostat 14 is refilled up to a percentage of its refill level. For example, if the cryostat 14 is not filled to 85% after sixty minutes, the system 10 can provide a visual and/or audible alarm. Further optionally, this step can include measuring the liquid level within the dewar 12, comparing the liquid level with a predetermined minimum acceptable liquid level (e.g., 4%), and halting the fill cycle and initiating a visual and/or audible alarm if the measured liquid level falls below the minimum acceptable liquid level.

The system and method of the present invention can therefore provide automated re-filling of a cryostat with helium. The system and method can overcome challenges associated with manual filling operations with minimal helium losses observed during laboratory testing. The above system and method were evaluated for cryo-magnets in 45-60 L baths, with cryogen losses of only 2%. Advantages of the above system and method include the elimination of manual cryogen fills, the elimination of cryogen fills during off-hours, and no interruption of experiments to conduct cryogen fills.

III. Example

In one example of the current embodiment, which is intended to be non-limiting, a PLC controller received voltage values from an AM1800 liquid level sensor, the voltage values being indicative of the helium liquid level within a 50 mm cryostat. The measured liquid levels were compared by the PLC controller against a lower trigger level (35%). When the measured liquid levels were less than the lower trigger level, a solenoid vent valve opened for three minutes to vent a 250 liter dewar, indicated by a white LED light on the controller panel. Pre-cooling then commenced for twenty minutes, during which time the pressure in a fourteen-foot liquid transfer line was raised to 0.5 PSI. Pre-cooling was accomplished by introducing $He^4$ gas into the dewar, indicated by a yellow LED light on the controller panel. After the twenty minutes expired, the fill cycle commenced, and the pressure within the transfer line increased to 1.2 PSI. The pressure in the dewar forced liquid helium into the liquid transfer line (with a G10 extension attached). The fill cycle continued for approximately forty minutes, indicated by a blue LED, until the measured liquid level within the cryostat reached an upper trigger level (85%). With the fill cycle concluded, a green LED indicated that the measured liquid level was now between the lower trigger level and the upper trigger level. The solenoid vent valve opened for three minutes to vent the dewar. While the system was in standby, the solenoid vent valve periodically opened for five second intervals to maintain the dewar pressure low and to minimize sipping of liquid helium into the cryostat. The cryostat liquid level was measured each minute by the AM1800 liquid level sensor. When the cryostat again reached the lower trigger level (35%), the process repeated itself. When the dewar liquid level reduced to a minimum acceptable volume (4%), the process halted and a red LED indicated that the dewar was in need of replacement.

The above description is that of current embodiments of the invention. Various alterations and changes can be made without departing from the spirit and broader aspects of the invention as defined in the appended claims, which are to be interpreted in accordance with the principles of patent law including the doctrine of equivalents. This disclosure is presented for illustrative purposes and should not be interpreted as an exhaustive description of all embodiments of the invention or to limit the scope of the claims to the specific elements illustrated or described in connection with these embodiments. The present invention is not limited to only those embodiments that include all of these features or that provide all of the stated benefits, except to the extent otherwise expressly set forth in the issued claims. Any reference to claim elements in the singular, for example, using the articles "a," "an," "the" or "said," is not to be construed as limiting the element to the singular. The technology disclosed and claimed herein may be available for licensing in specific fields of use by the assignee of record.

The invention claimed is:

1. A method of refilling a helium storage cryostat, the method comprising:
   venting gaseous helium from a dewar containing liquid helium in response to a liquid helium level within the helium storage cryostat declining to a lower set point value;
   after venting gaseous helium from the dewar, feeding gaseous helium to the dewar at a first pressure via a gas transfer line for at least a predetermined time period to pre-cool a liquid transfer line in fluid communication between the dewar and the helium storage cryostat;
   after pre-cooling the liquid transfer line, feeding gaseous helium to the dewar at a second pressure, greater than the first pressure, to force the liquid helium through the liquid transfer line and into the helium storage cryostat;
   measuring, using a helium liquid level meter, the level of liquid helium within the helium storage cryostat;
   stopping the feeding of gaseous helium into the dewar in response the level of liquid helium within the helium storage cryostat reaching an upper set point value; and
   venting gaseous helium from the dewar to prevent the build-up of pressure from within the dewar while the liquid transfer line remains in fluid communication between the dewar and the helium storage cryostat.

2. The method of claim 1 further including initiating an alarm if a predetermined time period lapses prior to the level of liquid helium within the cryostat reaching the upper set point value.

3. The method of claim 1 further including measuring, using the liquid level meter, the level of liquid helium within the dewar.

4. The method of claim 3 further including initiating an alarm if the level of liquid helium within the dewar falls below a predetermined acceptable level.

5. The method of claim 1 further including attaching an extension tube to the liquid transfer line and inserting the extension tube within the helium storage cryostat.

6. The method of claim 5 wherein the extension tube includes a plurality of exhaust holes at an upper end of the extension tube to vent gaseous helium boil-off from within the liquid transfer line.

7. The method of claim 1 wherein feeding gaseous helium to the dewar includes pressurizing gaseous helium to between 8 PSI and 10 PSI.

8. The method of claim 1 wherein the helium storage cryostat provides a cryogenic reservoir for a cryostat or a superconducting magnet.

9. The method of claim 1 wherein the helium storage cryostat provides a cryogenic reservoir for magnetic resonance imaging or nuclear magnetic resonance.

* * * * *